United States Patent
Wu et al.

(10) Patent No.: US 9,898,141 B2
(45) Date of Patent: Feb. 20, 2018

(54) TOUCH PANEL, METHOD FOR FABRICATING THE SAME AND TOUCH DISPLAY DEVICE

(71) Applicant: BOE Technology Group Co., Ltd., Beijing (CN)

(72) Inventors: Chunwei Wu, Beijing (CN); Chungchun Lee, Beijing (CN); Yanfeng Wang, Beijing (CN); Xiaoguang Xu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 103 days.

(21) Appl. No.: 14/804,785

(22) Filed: Jul. 21, 2015

(65) Prior Publication Data
US 2016/0291714 A1    Oct. 6, 2016

(30) Foreign Application Priority Data
Mar. 30, 2015 (CN) .......................... 2015 1 0145776

(51) Int. Cl.
*G06F 3/042* (2006.01)
*H01L 31/0216* (2014.01)
(Continued)

(52) U.S. Cl.
CPC ............ *G06F 3/042* (2013.01); *G06F 3/0412* (2013.01); *G06F 3/0416* (2013.01);
(Continued)

(58) Field of Classification Search
CPC ...... G06F 3/041; G06F 3/0412; G06F 3/0416; G06F 3/04; G06F 2203/04103;
(Continued)

(56) References Cited

U.S. PATENT DOCUMENTS

2003/0156087 A1* 8/2003 Boer ....................... G06F 3/042
345/92
2012/0025194 A1* 2/2012 Kim ....................... G06F 3/0412
257/60
(Continued)

FOREIGN PATENT DOCUMENTS

CN           102403314 A     4/2012

OTHER PUBLICATIONS

Mar. 23, 2017—(CN) First Office Action Appn 201510145776.7 with English Tran.

*Primary Examiner* — Nathan Danielsen
(74) *Attorney, Agent, or Firm* — Banner & Witcoff, Ltd.

(57) ABSTRACT

A touch panel, a method for fabricating the same and a touch display device are disclosed. The touch panel includes touch units, each of which includes: a capacitor having a first terminal connected to a first bias voltage; a first transistor having an amorphous silicon active layer, one of a source and a drain of the first transistor is connected to a third bias voltage and the other is connected to a second terminal of the capacitor; a second transistor having an oxide semiconductor active layer, a gate of the second transistor is connected to a scan line, one of a source and a drain of the second transistor is connected to the second terminal of the capacitor and the other is connected to a data line. The touch panel further includes a light-shielding layer; an aperture portion is disposed on a part of the light-shielding layer.

2 Claims, 4 Drawing Sheets

(51) Int. Cl.
*H01L 31/20* (2006.01)
*H01L 31/028* (2006.01)
*H01L 31/0296* (2006.01)
*H01L 31/113* (2006.01)
*G06F 3/041* (2006.01)
*H01L 31/18* (2006.01)
*H01L 27/146* (2006.01)

(52) U.S. Cl.
CPC ...... *H01L 27/14678* (2013.01); *H01L 31/028* (2013.01); *H01L 31/0296* (2013.01); *H01L 31/02164* (2013.01); *H01L 31/1136* (2013.01); *H01L 31/1828* (2013.01); *H01L 31/202* (2013.01); *G06F 2203/04103* (2013.01); *G06F 2203/04107* (2013.01)

(58) Field of Classification Search
CPC ............... G06F 2203/04107; H01L 27/14612–27/14616; H01L 27/14678; H01L 31/02164; H01L 31/028; H01L 31/0296; H01L 31/1136; H01L 31/1828; H01L 31/202
See application file for complete search history.

(56) References Cited

U.S. PATENT DOCUMENTS

| 2013/0146866 A1* | 6/2013 | Kitagawa | H01L 27/1225 257/43 |
| 2013/0214279 A1* | 8/2013 | Nishimura | G06F 3/0412 257/59 |

\* cited by examiner

TOUCH PANEL, METHOD FOR FABRICATING THE SAME AND TOUCH DISPLAY DEVICE

This application claims priority to Chinese Patent Application No. 201510145776.7 filed on Mar. 30, 2015. The present application claims priority to and the benefit of the above-identified application and is incorporated herein in its entirety.

FIELD OF THE ART

Embodiments of the invention relate to a touch panel, a method for fabricating the same and a touch display device.

BACKGROUND

An implementation for in-cell optical touch frequently used by conventional arts employs a photo sensor disposed in a pixel to realize external touch by sensing light shielding or reflection caused by a finger.

Specifically, according to the conventional art, in a photo sensing circuit in each pixel element on a touch panel, a transistor (which will be referred to as a "read-out transistor" hereafter) having a gate electrode connected to a scan line is disposed. In the meantime, one of a source electrode and a drain electrode of the transistor is connected to a data line and the other is connected to a capacitor for storing a touch signal. As a result, the transistor may scan and read out the touch signal of each pixel element.

However, as there may be current leakage with the read-out transistor, when a touch signal of a certain row of pixel elements is scanned and read out, the data line may receive noise signals generated by current leakage of other rows, which will cause misreading. On the other hand, to improve the response speed of touching, the read-out transistor has to finish reading the touch signal within a short time, which requires a large enough size of the read-out transistor. However, such a requirement will significantly reduce the aperture ratio of the pixels.

SUMMARY

A first aspect of the embodiment of the invention provides a touch panel comprising a substrate. A plurality of scan lines and a plurality of data lines are formed on the substrate, the plurality of scan lines and the plurality of data line intersect each other to define a plurality of touch units, and each of the touch units comprises: a capacitor having a first terminal connected to a first bias voltage; a first transistor having an active layer formed from amorphous silicon, a gate electrode of the first transistor is connected to a second bias voltage, one of a source electrode and a drain electrode of the first transistor is connected to a third bias voltage and the other is connected to a second terminal of the capacitor; a second transistor having an active layer formed from an oxide semiconductor, a gate electrode of the second transistor is connected to a scan line, one of a source electrode and a drain electrode of the second transistor is connected to the second terminal of the capacitor and the other is connected to a data line. The touch panel further comprises a light-shielding layer disposed above the substrate, and an aperture portion is disposed on at least a part of the light-shielding layer that corresponds to the active layer of the first transistor.

A second aspect of the invention provides a method for fabricating a touch panel, comprising:

forming a gate electrode of a first transistor and a gate electrode of a second transistor, wherein an active layer of the first transistor is formed from amorphous silicon and an active layer of the second transistor is formed from oxide semiconductor;

forming a gate insulation layer;

forming the active layer of the first transistor in at least a part of region of the gate insulation layer that corresponds to the gate electrode of the first transistor; and forming the active layer of the second transistor in at least a part of region of the gate insulation layer that corresponds to the gate electrode of the second transistor.

A third aspect of the invention provides a touch display device comprising any of the above touch panel.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The following embodiments of the invention provide a touch panel, a method for fabricating the same and a touch display device, which can solve the problem of having noise signals generated by the read-out transistors and low aperture ratio.

An embodiment of the invention provides a touch panel comprising a substrate, a plurality of scan lines and a plurality of data lines are formed on the substrate, and the plurality of scan lines and the plurality of data lines intersect each other to define a plurality of touch units. It is noted that, the scan lines and the data lines are lead wires formed from a conductive material on the substrate, and the touch units are defined by intersections of the scan lines and the data lines on the substrate.

Figure 1:
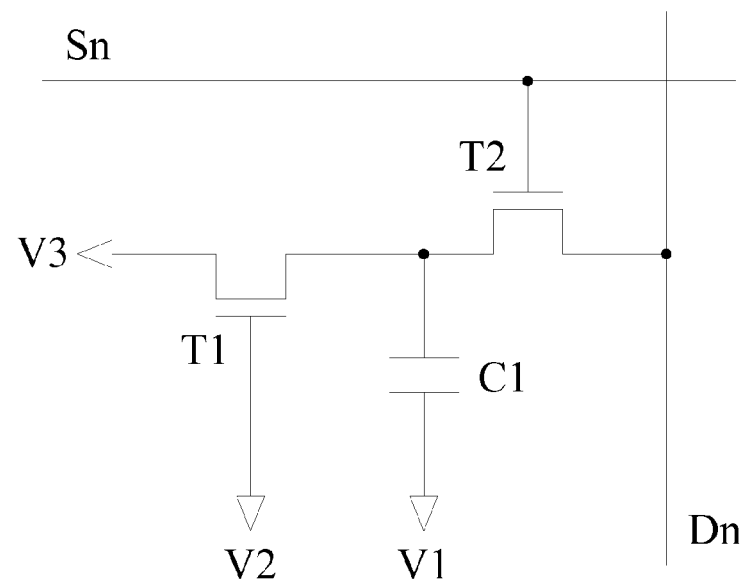
FIG. 1 schematically illustrates a circuit diagram inside a touch unit of a touch panel in accordance with an embodiment of the invention.

FIG. 1 schematically illustrates a circuit diagram inside a touch unit of a touch panel in accordance with an embodiment of the invention. As illustrated in FIG. 1, each of the touch units comprises:

a capacitor C1 having a first terminal connected to a first bias voltage V1;

a first transistor T1 having an active layer formed from amorphous silicon, a gate electrode of the first transistor T1 is connected to a second bias voltage V2, one of a source electrode and a drain electrode of the first transistor is connected to a third bias voltage V3 and the other is connected to a second terminal of the capacitor C1;

a second transistor T2 having an active layer formed from an oxide semiconductor, a gate electrode of the second transistor T2 is connected to a row of scan line Sn, one of a source electrode and a drain electrode of the second transistor T2 is connected to the second terminal of the capacitor C1 and the other is connected to a column of data line Dn.

The first transistor T1 may be an N-channel or P-channel Amorphous Silicon Thin Film Transistor (a-Si TFT). The second transistor T2 may be an N-channel or P-channel oxide TFT (i.e., oxide thin film transistor, such as a TFT with an active layer made of IZO or IGZO). The n-channel and p-channel thin film transistors have different ways of connecting the source and the drain electrodes, which can be configured as required for specific applications.

The touch panel may further comprise a light-shielding layer disposed above the substrate. An aperture portion is disposed on at least a part of the light-shielding layer that corresponds to the active layer of the first transistor T1, such that the active layer of the first transistor T1 can sense the light shielding when a finger touches the touch panel.

By way of the above structure, when a finger touches the touch panel, the aperture portions above the active layer of the first transistors T1 in some touch units will be shielded, therefore the property of the first transistors T1 in some touch units will change with the change of light which is received by the active layer, thereby further providing information on how the finger touches the touch panel.

The first transistor T1 illustrated in FIG. 1 can be in OFF state all the time under the effect of the second bias voltage V2, and may generate a relatively large current leakage flowing through the source electrode and the drain electrode, when the active layer is shielded. Due to the above fact, before the signal on the scan line Sn turns on the second transistor T2, when the potential difference between the first bias voltage V1 and the third bias voltage V3 is large enough, the current leakage generated by the shielding can be stored in the capacitor C1. After the signal on the scan line Sn turns on the second transistor T2, the second transistor T2 can output the touch signal stored in the capacitor to the data line Dn. In the case that each of the touch units has the above operating mode, by analyzing the touch signal outputted through the data line from each of the touch units, it is possible to learn how the surface of the touch panel is shielded by the finger, thereby realizing the in-cell optical touch.

It is noted that the flowing direction of the above current leakage may be any direction, as long as the condition that the difference between the third bias voltage V3 and the first bias voltage V1 is larger than a predetermined threshold value which is predetermined according specific applications. Moreover, each of the touch units corresponds to a scan line which is adapted to control the second transistor and also corresponds to a data line which is adapted to read the touch signal stored in the capacitor. A detailed driving method may be to apply scan signals to a plurality of rows of scan lines row by row. Under the control of each row of scan signal, the plurality of columns of data lines corresponding to the row of touch unit are read at the same time. In the meantime, according to specific device types of T1 and T2, the first to third bias voltages and the signals on the scan lines in the embodiment of the invention may have different settings, which will not be defined in the invention.

Moreover, based on the above principle of touch, the touch units may further comprise other circuit elements so as to further improve the touch effect or to realize other functions, which will not be defined in the invention.

Compared with conventional arts, in the embodiment of the invention, the first transistor T1 having an active layer formed from amorphous silicon functions as the photosensing transistor, and the second transistor T2 having an active layer formed from an oxide semiconductor functions as the read-out transistor.

When realizing actual operation of the optical touch, the second transistor normally has inevitable current leakage under OFF state. As a result, when the touch signals stored in the capacitors of a certain row of touch units is being read, they will be affected by current leakage of the second transistors T2 of other rows of touch units. To solve the technical problem, a well-known method in conventional arts tries to improve the circuit design and to reduce or remove the noise signals on the data lines by adding more circuit elements.

In contrast, to solve the above problem, the embodiment of the invention integrates two different kinds of thin film transistors, thereby solving the problem of generating noise signals and the aperture ratio being significantly reduced when the read-out transistors are used. Specifically, a second transistor having an active layer formed from an oxide semiconductor has a fast ON/OFF speed and a low current leakage, which helps to solve the problem of generating noise signals without requiring a large size when such a transistor functions as the read-out transistor. In the meantime, a first transistor having an active layer formed from amorphous silicon has a good photosensitive property to visible wavelengths, which provides good enough photosensing capability without requiring a large size. As a result, in comparison with conventional technologies, a photosensing circuit comprising the two kinds of transistors has better photosensing capability, lower noise signals and higher aperture ratio of the pixel, which helps to improve the touch performance of touch panels and to increase the aperture ratio thereof.

As an example, a portion of area of the touch unit occupied by the first transistor T1 may be smaller than or equal to a first predetermined value. The specific value of the first predetermined value may be configured according to the size of a pixel and the required photosensitive performance. It is obvious that an amorphous silicon thin film transistor having an active layer formed from amorphous silicon is relatively small in terms of the first predetermined value. In the meantime, a portion of area of the touch unit occupied by the second transistor T2 is smaller than or equal to a second predetermined value. The specific value of the second predetermined value may be configured according to requirements on reading speed of touch signal, upper limit of noise signals and the size of a pixel. It is obvious that an oxide thin film transistor having an active layer formed from an oxide semiconductor is relatively small in terms of the second predetermined value. Due to the above fact, the embodiment of the invention can realize better photosensing capability, lower noise signals and higher aperture ratio of the pixel, which helps to improve the touch performance of touch panels and to increase the aperture ratio thereof.

A detailed embodiment of the invention will be described in the following with reference to an example of a touch panel.

Figure 2:
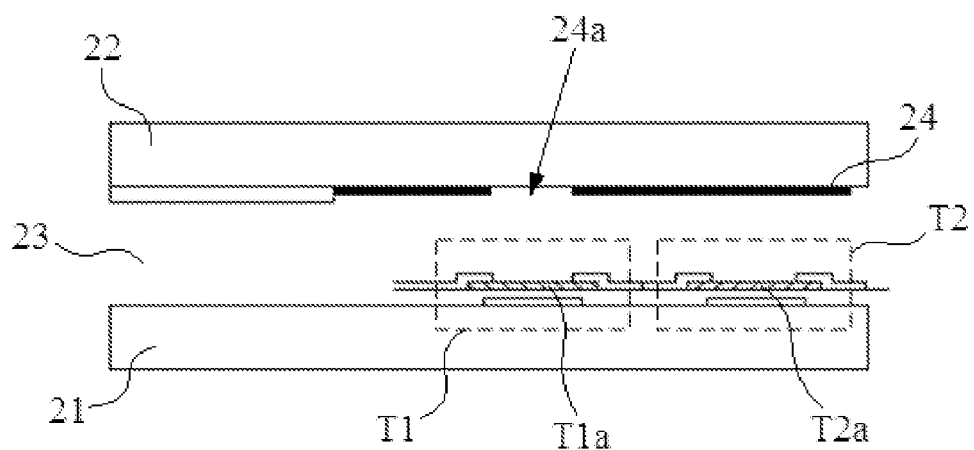
FIG. 2 schematically illustrates a structure of a touch panel along the thickness direction in accordance with an embodiment of the invention.

FIG. 2 schematically illustrates a structure of a touch panel along the thickness direction in accordance with an embodiment of the invention. It is noted that FIG. 2 schematically illustrates only a partial structure of a touch unit on the touch panel, and does not fully illustrate the internal structure of the touch panel and detailed circuit diagram of the touch unit. As illustrated in FIG. 2, the touch panel comprises an array substrate 21, a color filter substrate 22 and a liquid crystal layer 23 disposed between the array substrate 21 and the color filter substrate 22. With reference to the display principle of liquid crystal displays, it is known that the liquid crystal layer 23 may deflect under the effect of a pixel electrode and a common electrode, which changes the light transmissivity of the liquid crystal 23 in a corresponding pixel (not illustrated in the figures). In the meantime, a light-shielding layer 24 is disposed on the non-display portion of the color filter substrate 22, which can shield the circuit of the TFT in the pixel.

The touch panel further comprises a plurality of scan lines and a plurality of data lines disposed on the array substrate 21, and the plurality of scan lines and the plurality of data line intersect each other to define a plurality of touch units (not shown in figure). A first transistor T1 and a second transistor T2 as illustrated in FIG. 2 are disposed in each of the touch units. An active layer T1a of the first transistor T1 is formed from amorphous silicon, and an active layer T2a of the second transistor T2 is formed from an oxide semiconductor. Moreover, in at least a part of the region corresponding to the active layer T1a of the first transistor T1, an aperture portion 24a is disposed on the light-shielding layer 24. Based on the above, the aperture portion 24a may be appropriately enlarged or reduced to realize a better effect of optical touch.

Figure 3:
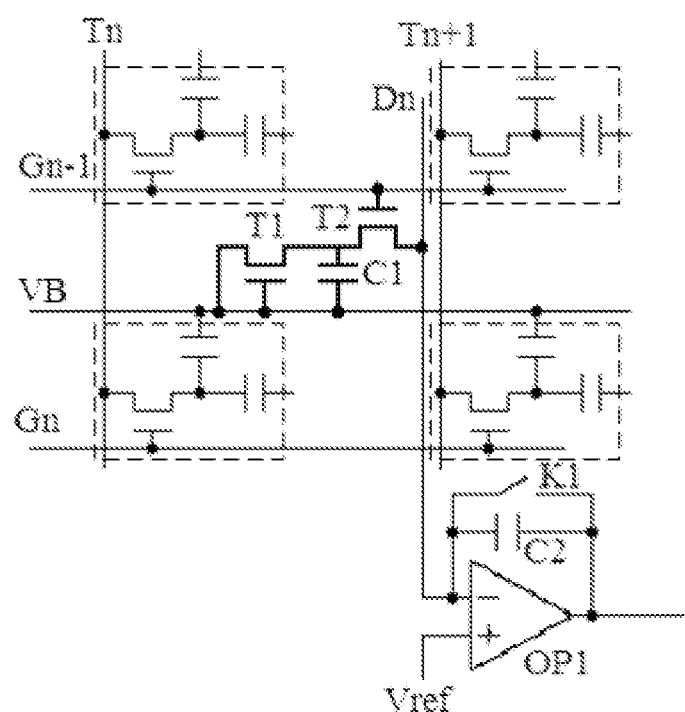
FIG. 3 schematically illustrates a partial circuit diagram on an array substrate of a touch panel in accordance with an embodiment of the invention.

FIG. 3 schematically illustrates a partial circuit diagram on an array substrate of a touch panel in accordance with an embodiment of the invention. A plurality of gate lines and a plurality of grey scale voltage lines are disposed on the base substrate of the array substrate 21, and the plurality of gate lines and the plurality of grey scale voltage lines intersect each other to define a plurality of pixel units. FIG. 3 specifically illustrates the n−1-th row gate line $G_{n-1}$, the n-th row gate line $G_n$, the n-th column grey scale voltage line $T_n$ and the n+1-th column grey scale voltage line $T_{n+1}$, and further illustrates a pixel unit at the n-th row and the n-th column which is defined by the two rows of gate lines and the two columns of grey scale voltage lines. Moreover, a pixel circuit as illustrated in the dashed box in FIG. 3 is disposed in each of the pixel units and configured for writing the grey scale voltage on the grey scale voltage line to the pixel electrode (not shown in FIG. 3), under the driving of the signal on the gate line. It can be contemplated that the pixel circuit as illustrated in the FIG. 3 is for illustrative purpose only, and the circuit structure may be configured with reference to conventional technologies.

In the touch unit of the embodiment of the invention, the gate line on the base substrate of the array substrate is also used as the scan line for defining the touch unit. That is, any row of the above scan lines and the gate lines on the substrate of the array substrate are formed from the same conductive wire, and gate signals on the gate lines are also used as signals on the scan lines for controlling the ON/OFF of the second transistor T2. Moreover, as the starting point and ending point, extending trend and the disposing position of the data line are similar to that of the grey scale voltage line, the data line and the grey scale voltage line can be disposed at adjacent positions in parallel as the data line $D_n$ and the grey scale voltage line $T_{n+1}$ illustrated in FIG. 3. Due to the above fact, the touch unit and the pixel unit almost coincide with each other. For example, the touch unit at the n−1-th row and the n-th column is almost coincident with the pixel unit at the n-th row and the n-th column.

In the touch unit at the n−1-th row and the n-th column which is illustrated in FIG. 3, a first terminal of a capacitor C1 is connected to a bias voltage VB, a gate electrode of the first transistor is also connected to the bias voltage VB, one of a source electrode and a drain electrode of the first transistor is connected to a second terminal of the capacitor C1 and the other is connected to the bias voltage VB. A gate electrode of a second transistor is connected to the gate line $G_{n-1}$, one of a source electrode and a drain electrode of the second transistor is connected to a second terminal of the capacitor C1 and the other is connected to the data line $D_n$.

Unlike the previous embodiment, the touch unit in the embodiment of the invention further comprises a bias voltage line VB. The above described first bias voltage V1, second bias voltage V2 and third bias voltage V3 are equal to each other and are all provided by the bias voltage line VB. Thus, the first transistor T1 can control the current which is used to charge the second terminal of the capacitor C1 according to the light intensity received by the active layer. Thereby, when the capacitor C1 is not fully charged, the voltage across the two terminals thereof represents the shielding of the active layer of the first transistor T1, thus the voltage signal across the two terminals of the capacitor C1 is the touch signal. Based on such a structure, the above described first bias voltage V1, second bias voltage V2 and third bias voltage V3 are all provided by the same bias voltage line VB, thereby simplifying the circuit structure and reducing the cost.

The above touch panel further comprises a touch signal processing circuit which is connected to at least one data line, and the touch signal processing circuit is configured to collect a signal from the data line and to produce a touch response signal. As an example, the touch signal processing circuit may comprise an operational amplifier OP1, a capacitor C2 and a switch K1 as illustrated in FIG. 3, wherein a negative input terminal of the operational amplifier OP1 is connected to a first terminal of the capacitor C2, a first terminal of the switch and the data line $D_n$, and a positive input terminal is connected to a reference voltage Vref, thus the OPI amplifies the touch signal on the data line $D_n$ and outputting the touch respond signal at its output terminal. Specifically, the touch signal processing circuit as illustrated in FIG. 3 applies an integral operation to the touch control signal on $D_n$ to get an overall voltage stored in the capacitor C1 during the period of each frame, thereby determining whether the finger shields the touch unit according to the value of voltage. It is possible to get the touch response signal representing how the finger touches the touch panel when determination results of all touch units are combined. It can be understood that, the touch signal processing circuit can be configured with reference to conventional technologies, which will not be elaborated herein.

Figure 4:
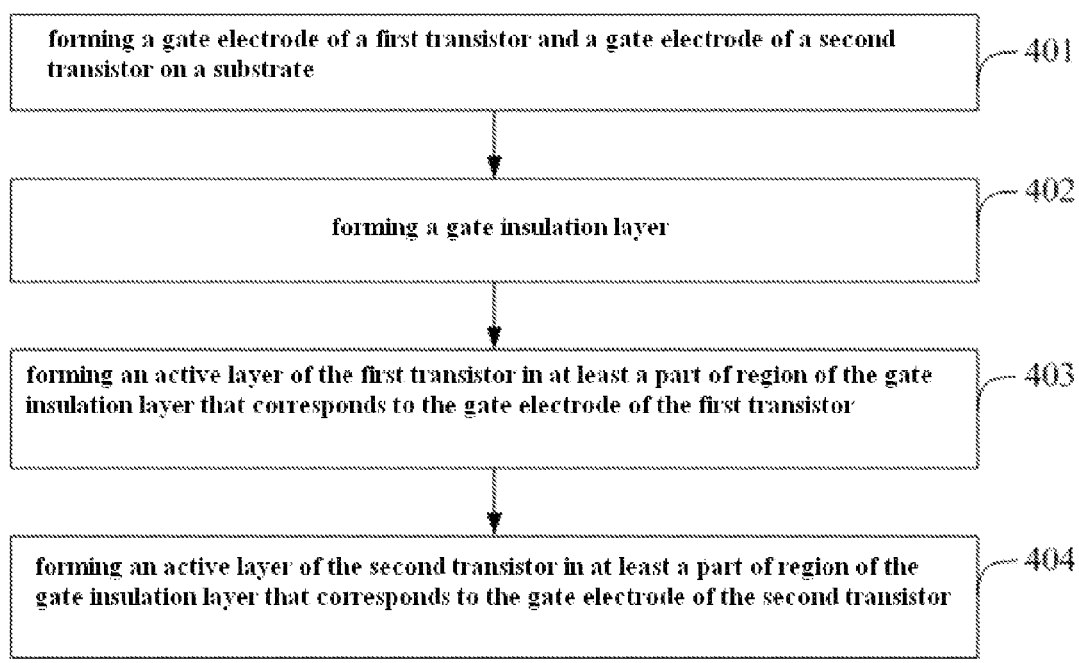
FIG. 4 schematically illustrates a flow chart of a method for fabricating a touch panel in accordance with an embodiment of the invention.

FIG. 4 schematically illustrates a flow chart of a method for fabricating a touch panel in accordance with an embodiment of the invention. As illustrated in FIG. 4, the method comprises:

Step 401: forming a gate electrode of a first transistor and a gate electrode of a second transistor on a substrate;

Step 402: forming a gate insulation layer;

Step 403: forming an active layer of the first transistor in at least a part of region of the gate insulation layer that corresponds to the gate electrode of the first transistor; and Step 404: forming an active layer of the second transistor in at least a part of region of the gate insulation layer that corresponds to the gate electrode of the second transistor.

The formation of a certain layer or pattern in any of the above steps can be realized through a patterning process. It is seen that, the method provided by the embodiment of the invention can be used to fabricate the first transistor and the second transistor on the substrate of any of the above touch panels, and can solve the problem that the amorphous silicon semiconductor process compromises the performance of oxide semiconductor devices.

When forming the amorphous silicon semiconductor active layer of the first transistor, the amorphous silicon process uses SiH4 gas and generates a large amount of H during the process. The H can easily react with the O in the oxide semiconductor, thereby significantly compromising the performance of the oxide semiconductor devices.

Due to the above fact, as an example, the active layer of the first transistor is formed first, and then the active layer of the second transistor is formed afterwards, thereby preventing the amorphous silicon semiconductor process from compromising the performance of the oxide semiconductor devices.

As an example, the method further comprises the following steps which are not illustrated in FIG. 4:

Step 405: forming an etch stop layer on the active layer of the second transistor, wherein a source electrode via hole and a drain electrode via hole are formed in the etch stop layer;

Step 406: forming a source electrode and a drain electrode of the first transistor as well as a source electrode and a drain electrode of the second transistor;

Step 407: forming a passivation layer.

In the embodiment or other embodiments of the invention, the source electrode and drain electrode of the first transistor are electrically connected to the active layer of the first transistor through the source electrode via hole and the drain electrode via hole respectively; the source electrode and drain electrode of the second transistor are electrically connected to the active layer of the second transistor through another source electrode via hole and another drain electrode via hole respectively. The passivation layer overlays the whole substrate. Similarly, the formation of a certain layer or pattern in any of the above steps can be realized through a patterning process. Due to the above fact, the embodiment of the invention can be used to fabricate any of the above touch panels, thus solving the problem of generating noise signals and the aperture ratio being significantly reduced when the read-out transistors are used, and helping to improve the touch performance of touch panels and to increase the aperture ratio thereof. Further, the method provided by the embodiment of the invention can integrate and fabricate optical touch panels with high photosensing performance, high read speed and low current leakage noise with only one patterning process added, and can increase the aperture ratio of the pixel while maintaining the performance.

Figure 5:
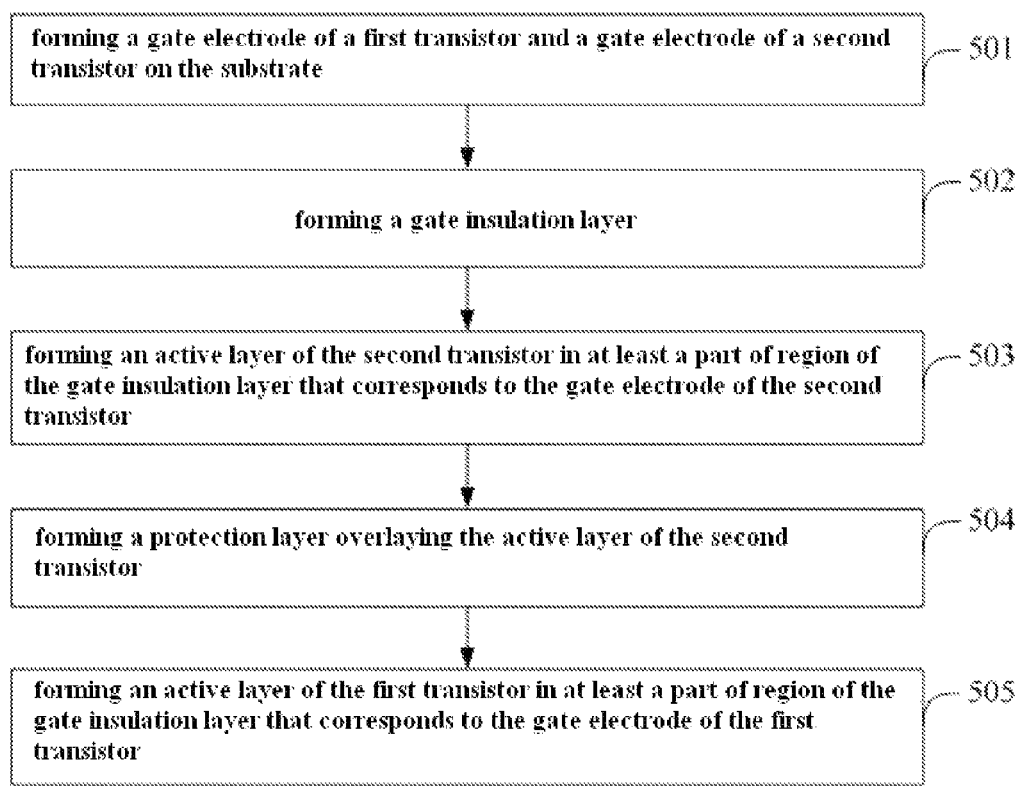
FIG. 5 schematically illustrates a flow chart of a method for fabricating a touch panel in accordance with another embodiment of the invention.

FIG. 5 schematically illustrates a flow chart of a method for fabricating a touch panel in accordance with another embodiment of the invention. As illustrated in FIG. 5, the method comprises:

Step 501: forming a gate electrode of a first transistor and a gate electrode of a second transistor on the substrate;

Step 502: forming a gate insulation layer;

Step 503: forming an active layer of the second transistor in at least a part of region of the gate insulation layer that corresponds to the gate electrode of the second transistor;

Step 504: forming a protection layer overlaying the active layer of the second transistor;

Step 505: forming an active layer of the first transistor in at least a part of region of the gate insulation layer that corresponds to the gate electrode of the first transistor.

The formation of a certain layer or pattern in any of the above steps can be realized through a patterning process. In the embodiment of the invention, the steps of forming the active layer of the first transistor and forming the active layer of the second transistor are interchangeable.

The protection layer (can be made of for example silicon oxide or silicon nitride) which overlays the active layer of the second transistor and is formed in step 504 can prevent the oxide semiconductor from reacting with the H generated during the process of forming amorphous silicon, thereby preventing the amorphous silicon semiconductor process from compromising the performance of the oxide semiconductor devices.

As an example, before the step 505, the method further comprises the following step which is not illustrated in FIG. 5:

Step 504a: removing the protection layer through an etching process.

As an example, the silicon oxide protection layer can be removed through a dry etching process, thereby continuing the subsequent processes, and preventing the disposition of the protection layer from affecting the device properties or structure of the array substrate.

As an example, the above method further comprises the following steps which are not illustrated in FIG. 5:

Step 506: forming an etch stop layer on the active layer of the second transistor, wherein a source electrode via hole and a drain electrode via hole are formed in the etch stop layer;

Step 507: forming a source electrode and a drain electrode of the first transistor as well as a source electrode and a drain electrode of the second transistor; and Step 508: forming a passivation layer;

Similarly, the formation of a certain layer or pattern in any of the above steps can be realized through a patterning process. Due to the above fact, the embodiment of the invention can be used to fabricate any of the above touch panels, thus solving the problem of generating noise signals and the aperture ratio being significantly reduced when the read-out transistors are used, and helping to improve the touch performance of touch panels and to increase the aperture ratio thereof. Further, the method provided by the embodiment of the invention can integrate and fabricate optical touch panels with high photosensing performance, high read speed and low current leakage noise with only one patterning process added, and can increase the aperture ratio of the pixel while maintaining the performance.

An embodiment of the invention further provides a touch display device, which comprises any of the above touch panels. It is noted that, the touch display device may be an e-paper device, a mobile phone, a tablet PC, a television, a laptop computer, a digital photo-frame, a navigator or any product or component with a display function. As the touch display device comprises any of the above touch panel, it can solve the same technical problem and achieve the same technical effect.

It is seen from the above embodiments that the invention employs the second transistor having the active layer formed from oxide semiconductor as the read-out transistor and the first transistor having the active layer formed from amorphous silicon as the photosensitive component of the photosensitive device, the capacitor can store touch signals input from the source electrode or the drain electrode of the first transistor, and the second transistor can scan and read the touch signals stored in the capacitor row by row under the control of signals on the scan line, thereby realizing in-cell optical touch.

The second transistor having the active layer formed from the oxide semiconductor has a fast ON/OFF speed and low current leakage, which helps to solve the problem of generating noise signals without requiring a large size when such a transistor functions as the read-out transistor. In the meantime, the first transistor having the active layer formed from amorphous silicon has a good photosensitive property to visible wavelengths, which provides good enough photosensing capability without requiring a large size. As a result, in comparison with conventional technologies, the photosensing circuit comprising the two kinds of transistors has better photosensing capability, lower noise signals and higher pixel aperture ratio, which helps to improve the touch performance of touch panels and to increase the aperture ratio thereof.

What is described above is related to the illustrative embodiments of the disclosure only and not limitative to the scope of the disclosure; the scopes of the disclosure are defined by the accompanying claims.

This application claims the priority of Chinese Patent Application No. 201510145776.7, filed on Mar. 30, 2015, the disclosure of which is incorporated herein by reference in its entirety.

What is claimed is:

1. A method for fabricating a touch panel, comprising:
   forming a gate electrode of a first transistor and a gate electrode of a second transistor on a substrate;
   forming a gate insulation layer;
   forming an active layer of the first transistor in at least a part of region of the gate insulation layer that corresponds to the gate electrode of the first transistor; and
   forming an active layer of the second transistor in at least a part of region of the gate insulation layer that corresponds to the gate electrode of the second transistor;
   wherein the active layer of the first transistor is formed from amorphous silicon and the active layer of the second transistor is formed from oxide semiconductor;
   wherein before forming the active layer of the first transistor, the method further comprises: forming a protection layer overlaying the active layer of the second transistor and removing the protection layer through an etching process.

2. The method of claim 1, further comprising:
   forming an etch stop layer on the active layer of the second transistor, wherein a via hole is formed in the etch stop layer;
   forming a source electrode and a drain electrode of the first transistor as well as a source electrode and a drain electrode of the second transistor; and
   forming a passivation layer.

* * * * *